(12) United States Patent
Byun et al.

(10) Patent No.: US 11,810,522 B2
(45) Date of Patent: Nov. 7, 2023

(54) PIXEL CIRCUIT DRIVING METHOD, PIXEL CIRCUIT THEREFOR, AND DISPLAY MODULE USING THE SAME

(71) Applicants: Electronics and Telecommunications Research Institute, Daejeon (KR); IUCF-HYU (Industry-University Cooperation Foundation Hanyang University), Seoul (KR)

(72) Inventors: Chun Won Byun, Daejeon (KR); Chan Mo Kang, Daejeon (KR); Nam Sung Cho, Daejeon (KR); Byong Deok Choi, Seoul (KR); Yong Duck Kim, Seoul (KR)

(73) Assignees: Electronics and Telecommunications Research Institute, Daejeon (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 0 days.

(21) Appl. No.: 17/940,431

(22) Filed: Sep. 8, 2022

(65) Prior Publication Data
US 2023/0230550 A1     Jul. 20, 2023

(30) Foreign Application Priority Data
Jan. 17, 2022    (KR) .................. 10-2022-0006497

(51) Int. Cl.
*G09G 3/3291*     (2016.01)
*G09G 3/3233*     (2016.01)
*G09G 3/20*        (2006.01)

(52) U.S. Cl.
CPC ......... *G09G 3/3291* (2013.01); *G09G 3/2018* (2013.01); *G09G 3/3233* (2013.01);
(Continued)

(58) Field of Classification Search
CPC .. G09G 3/3291; G09G 3/2018; G09G 3/3233; G09G 2310/027;
(Continued)

(56) References Cited

U.S. PATENT DOCUMENTS 7,119,773 B2 * 10/2006   Kim ..................... G09G 3/3233
                                                                   345/63
7,167,169 B2 * 1/2007   Libsch ................. G09G 3/3233
                                                                   345/82

(Continued)

FOREIGN PATENT DOCUMENTS

KR    10-2021-0108742 A    9/2021
KR    10-2021-0128149 A    10/2021

*Primary Examiner* — Michael J Jansen, II
(74) *Attorney, Agent, or Firm* — NSIP Law

(57) ABSTRACT

A pixel circuit driving method of controlling an operation of a light-emitting element provided in a pixel of a display panel may comprise: applying pulse amplitude modulation (PAM) signals having a plurality of levels to a first terminal of a first transistor having a second terminal connected to a control terminal of a second transistor configured to drive the light-emitting element with a current according to a gray scale required for the light-emitting element; and applying a PAM signal of any one level selected from the PAM signals to the control terminal of the second transistor during each sub-frame time corresponding to a turn-on time of the first transistor controlled by a pulse width modulation (PWM) signal having a plurality of sub-frames in a single frame according to the gray scale.

20 Claims, 17 Drawing Sheets

(52) U.S. Cl.
CPC .............. *G09G 2310/027* (2013.01); *G09G 2320/0633* (2013.01)

(58) Field of Classification Search
CPC ......... G09G 2320/0633; G09G 3/2014; G09G 3/2022; G09G 3/2025; G09G 3/2081
See application file for complete search history.

(56) References Cited

U.S. PATENT DOCUMENTS

| | | | | |
|---|---|---|---|---|
| 8,643,570 B2* | 2/2014 | Okamoto | ............. | G09G 3/3241 |
| | | | | 345/76 |
| 9,349,313 B2* | 5/2016 | Kawae | ................ | G09G 3/3225 |
| 9,466,242 B2* | 10/2016 | Qing | .................. | G06F 3/04184 |
| 9,570,005 B2* | 2/2017 | Qing | .................. | G09G 3/3233 |
| 10,157,578 B2* | 12/2018 | Kikuchi | ............. | H03M 1/1014 |
| 10,504,406 B2* | 12/2019 | Shigeta | ............... | G09G 3/2081 |
| 10,706,766 B2* | 7/2020 | Kim | ........................ | G09G 3/32 |
| 10,861,380 B2* | 12/2020 | Horowitz | ........... | G02B 26/0833 |
| 11,495,171 B2* | 11/2022 | Kim | ........................ | G09G 3/32 |
| 11,551,606 B2* | 1/2023 | Kim | ..................... | G09G 3/3233 |
| 11,663,960 B2* | 5/2023 | Hashimoto | .............. | G09G 3/32 |
| | | | | 345/214 |
| 2001/0019319 A1* | 9/2001 | Kim | ..................... | G09G 3/3233 |
| | | | | 345/77 |
| 2003/0107565 A1* | 6/2003 | Libsch | ................. | G09G 3/3233 |
| | | | | 345/211 |
| 2009/0002281 A1* | 1/2009 | Okamoto | ............ | G09G 3/3241 |
| | | | | 345/76 |
| 2014/0152709 A1* | 6/2014 | Kawae | ................. | G09G 3/2022 |
| | | | | 345/77 |
| 2014/0306867 A1* | 10/2014 | Qing | .................... | G09G 3/3233 |
| | | | | 345/76 |
| 2015/0221255 A1* | 8/2015 | Qing | ..................... | G06F 3/0412 |
| | | | | 345/212 |
| 2016/0351130 A1* | 12/2016 | Kikuchi | ............... | G09G 3/3233 |
| 2018/0293929 A1* | 10/2018 | Shigeta | ................ | G09G 3/3233 |
| 2019/0347981 A1* | 11/2019 | Horowitz | ............. | H04N 9/3135 |
| 2020/0111404 A1* | 4/2020 | Kim | ..................... | G09G 3/2014 |
| 2020/0394953 A1* | 12/2020 | Kim | ........................ | G09G 3/32 |
| 2022/0199001 A1* | 6/2022 | Kim | ..................... | G09G 3/3233 |
| 2022/0215796 A1* | 7/2022 | Zhai | ......................... | G09G 3/32 |
| 2022/0301501 A1* | 9/2022 | Oh | ........................... | G09G 3/32 |
| 2023/0005416 A1* | 1/2023 | Oh | ........................ | G09G 3/32 |
| 2023/0057215 A1* | 2/2023 | Hashimoto | .......... | G09G 3/2011 |

\* cited by examiner

PIXEL CIRCUIT DRIVING METHOD, PIXEL CIRCUIT THEREFOR, AND DISPLAY MODULE USING THE SAME

CROSS-REFERENCE TO RELATED APPLICATIONS

This application claims priority to Korean Patent Application No. 10-2022-0006497, filed on Jan. 17, 2022, with the Korean Intellectual Property Office (KIPO), the entire contents of which are hereby incorporated by reference.

BACKGROUND

1. Technical Field

Exemplary embodiments of the present disclosure relate to a pixel circuit driving method, and more specifically, to a pixel circuit driving method for controlling an operation of a self-emission element provided in each sub-pixel of a display module including a plurality of pixels each including a plurality of sub-pixels, a pixel circuit therefor, and a display module using the same.

2. Related Art

Generally, pixel circuits of most of organic light-emitting diode (OLED) display modules use a current driving method of controlling the luminance of an OLED by receiving a data voltage and controlling a current of a driving transistor.

Accordingly, in the driving of a conventional OLED, a pulse amplitude modulation (PAM) driving method of controlling a current of the OLED by a current level is mainly used rather than a pulse width modulation (PWM) driving method of controlling the current of the OLED by a driving time.

In the PAM driving method, the current of the OLED is adjusted by adjusting a strength of a voltage applied to a control terminal of the driving transistor. The PWM driving method is a kind of digital driving method and uses a plurality of sub-frames designed with binary weights in one frame corresponding to a unit driving time for gray scale expression of each pixel.

However, in the case of an OLED, it is very difficult to adjust a gray scale due to noise, a leakage current, and a characteristic deviation between elements in a low gray scale which requires a low current level of picoamperes (pA) and is designed with a relatively small weight unlike a high gray scale, which requires a high current level and is designed with a relatively large weight. The case of the LED or (quantum dot light-emitting diode) QLED is similar to the case of the OLED.

That is, as shown in Equation 1 below, a current IEM of the OLED, which should maintain a specific level according to a required gray scale, is proportional to a voltage difference between a gate-source voltage $V_{GS}$ and a threshold voltage $V_{TH}$ of the driving transistor, and there is a problem in that this voltage difference is vulnerable to noise, a characteristic deviation, a leakage current, stress, and the like.

$$I_{EM} = \mu C_{OX} \frac{W}{L} V_T^2 \exp\left(\frac{V_{GS} - V_{TH}}{nV_T}\right) = I_0 \exp\left(\frac{V_{GS} - V_{TH}}{nV_T}\right) \quad \text{[Equation 1]}$$

Here, μ denotes the mobility of the driving transistor, $C_{OX}$ denotes the oxide capacitance of the driving transistor, W denotes a channel width of the driving transistor, L denotes a channel length of the driving transistor, $V_{GS}$ denotes a source-gate voltage of the driving transistor, $V_{TH}$ denotes a threshold voltage of the driving transistor, and $V_T$ denotes a thermal voltage of the OLED.

A conventional PWM driving circuit includes at least two transistors and at least one capacitor, and operates by a display period separated (DPS) method of designing one frame time, for example, as sum of sub-frame times having a binary weight of 8-bits, and then classifying a scan time and an emission time of the OLED to express a 256 gray scale or by a simultaneous erasing scan (SES) method of using an erase operation according to lengths of the emission time and the scan time.

In the OLED driving method of the DPS method or the SES method, since a gray scale of $2^N$ is expressed using preset N-bit sub-frames such as 8-bit sub-frames, it is not easy to implement sub-frames corresponding to a 256 gray scale, and since the driving transistor is used as a switch, an anode voltage of a light-emitting element is fixed to a power supply voltage VDD at a high potential and thus compensation for a deviation of the light-emitting element is difficult, and accordingly, an error usually occurs at a gray scale of approximately 10% due to an error of the light-emitting element itself or the like.

Like the above, a current $I_{OLED}$ flowing through an OLED in a conventional pixel circuit can easily have deviations V1 and V2 due to various conditions in a low gray scale such as 1-gray when assuming, for example, 8-bit gray, that is, 256-level gray scales. That is, as shown in FIG. 1, the current $I_{OLED}$ flowing through the OLED can have a deviation such as a minimum current OLED_MIN and a maximum current OLED_MAX, and can have a first deviation V1 and a second deviation V2 in the 1-gray with respect to an average current OLED_AVG.

For this reason, a pixel circuit for PWM driving of a conventional OLED panel often includes various inner compensation circuits. However, when the inner compensation circuit is provided, there is a disadvantage in that the number of components of the pixel circuit increases and thus the size of the pixel circuit increases, or a circuit configuration becomes complicated in the same pixel area, and in some cases, an emission area of the OLED should be reduced.

SUMMARY

Accordingly, exemplary embodiments of the present disclosure are provided to substantially obviate one or more problems due to limitations and disadvantages of the related art.

Exemplary embodiments of the present disclosure provide a new pixel circuit driving method for efficient driving control of an inorganic light-emitting diode (LED), a micro-LED, an organic LED (OLED), and a quantum dot light-emitting diode (QLED) used in a pixel of a display panel or other similar light-emitting elements of the same type.

Exemplary embodiments of the present disclosure also provide a new pixel circuit suitable for the above-described pixel circuit driving method.

Exemplary embodiments of the present disclosure also provide a display module using the above-described pixel circuit driving method.

According to a first exemplary embodiment of the present disclosure, a pixel circuit driving method of controlling an operation of a light-emitting element provided in a pixel of a display panel may comprise: applying pulse amplitude modulation (PAM) signals having a plurality of levels to a first terminal of a first transistor having a second terminal connected to a control terminal of a second transistor configured to drive the light-emitting element with a current according to a gray scale required for the light-emitting element; and applying a PAM signal of any one level selected from the PAM signals to the control terminal of the second transistor during each sub-frame time corresponding to a turn-on time of the first transistor controlled by a pulse width modulation (PWM) signal having a plurality of sub-frames in a single frame according to the gray scale.

The number of sub-frames of the PWM signal may be smaller than the number of bits for expressing a gray scale preset for the light-emitting element.

The pixel circuit may include the first transistor, the second transistor, and a capacitor, the first transistor may include the first terminal, the second terminal, and a first control terminal, the second transistor may include a first terminal, a second terminal, and the second control terminal, the first terminal and the second terminal of the second transistor may be respectively connected to the light-emitting element and a first power supply voltage, a first terminal of the capacitor may be connected to the first terminal or the second terminal of the second transistor, and a second terminal of the capacitor may be commonly connected to the second terminal of the first transistor and the second control terminal of the second transistor.

The pixel circuit may further include a capacitor and a third transistor, the capacitor may be connected between a terminal at one side of the second transistor and the second terminal of the first transistor, a first terminal of the third transistor may be connected to the first power supply voltage, and a second terminal of the third transistor may be commonly connected to the second terminal of the capacitor, the second terminal of the first transistor, and the second control terminal of the second transistor, the pixel circuit driving method may further comprise turning on the third transistor to charge the capacitor.

The pixel circuit may further include a capacitor and a third transistor, the capacitor may be connected between a terminal at one side of the second transistor and the second terminal of the first transistor, and the third transistor may be connected in series between the first power supply voltage and the light-emitting element, the pixel circuit driving method may further comprise turning off the third transistor when an emission time of the light-emitting element overlaps a scan time in which any one PWM signal is applied.

A scan time in which the PWM signal is applied may overlap an emission time of the light-emitting element.

A scan time in which the PWM signal is applied may not overlap an emission time of the light-emitting element.

According to a second exemplary embodiment of the present disclosure, a pixel circuit for controlling an operation of a light-emitting element provided in a pixel of a display panel may comprise: a second transistor having a first terminal and a second terminal respectively connected to the light-emitting element and a first power supply voltage; a first transistor having a second terminal connected to a control terminal of the second transistor and a first terminal connected to data lines; and a capacitor having a first terminal connected to the first power supply voltage and a second terminal commonly connected to the second terminal of the first transistor and the control terminal of the second transistor, wherein pulse amplitude modulation (PAM) signals having a plurality of levels are level-selectively applied to the first terminal of the first transistor through the data lines, a pulse width modulation (PWM) signal having a plurality of sub-frames in a single frame is applied to the control terminal of the first transistor according to the number of preset bits or gray scales of levels, and a PAM signal of any one level selected from the PAM signals is applied to the control terminal of the second transistor during each sub-frame period of the PWM signal for a turn-on time of the first transistor controlled by the PWM signal.

The number of sub-frames of the PWM signal may be smaller than the number of bits for expressing a gray scale preset for the light-emitting element.

The pixel circuit may further comprise a third transistor, wherein a first terminal of the third transistor may be connected to the first power supply voltage, and a second terminal of the third transistor may be commonly connected to the second terminal of the capacitor, the second terminal of the first transistor, and the control terminal of the second transistor.

The capacitor may be charged in a turn-on period of the third transistor.

The pixel circuit may further comprise a third transistor connected in series between a common connection point of the light-emitting element and the first terminal of the capacitor and the first power supply voltage.

The third transistor may be turned off when an emission time of the light-emitting element overlaps a scan time in which the PWM signal is applied.

According to a third exemplary embodiment of the present disclosure, a display module may comprise: a pixel unit in which a plurality of pixels are arranged; a data driver configured to supply a data signal to the pixel unit; a gate driver configured to supply a scan signal to the pixel unit; and a timing controller configured to control operations of the data driver and the gate driver, wherein the data driver applies pulse amplitude modulation (PAM) signals having a plurality of levels as the data signal to a first terminal of a first transistor having a second terminal connected to a control terminal of a second transistor according to a gray scale required for a light-emitting element coupled to each pixel, the gate driver applies a pulse width modulation (PWM) signal having a plurality of sub-frames in a single frame as the scan signal to a control terminal of the first transistor according to the gray scale, and a PAM signal of any one level selected from the PAM signals is applied to the control terminal of the second transistor configured to supply a gray scale current to the light-emitting element for a turn-on time of the first transistor or for each sub-frame.

The number of sub-frames of the PWM signal may be smaller than the number of bits of gray scale data set for at least one pixel or a sub-pixel included in the at least one pixel.

A pixel circuit configured to drive the light-emitting element of the pixel or sub-pixel with a current may include: the second transistor having a first terminal and a second terminal respectively connected to the light-emitting element and a first power supply voltage; the first transistor having the second terminal connected to the control terminal of the second transistor and the first terminal connected to data lines; and a capacitor having a first terminal connected to the first power supply voltage and a second terminal commonly connected to the second terminal of the first transistor and the control terminal of the second transistor.

The pixel circuit may further include a third transistor, a first terminal of the third transistor may be connected to the first power supply voltage, a second terminal of the third transistor may be commonly connected to the second terminal of the capacitor, the second terminal of the first transistor, and the second control terminal of the second transistor, and the capacitor may be charged in a turn-on period of the third transistor.

The pixel circuit may further include a third transistor connected in series between a common connection point of the light-emitting element and the first terminal of the capacitor and the first power supply voltage.

The third transistor may be turned off when an emission time of the light-emitting element overlaps a scan time in which the PWM signal is applied.

The number of output channels of a decoder provided in the data driver may be smaller than the number of preset gray scales expressed by a predetermined bit.

According to the present disclosure, since the number of sub-frames of a pulse width modulation (PWM) signal can be reduced compared to a conventional PWM driving method, a power reduction effect of 50% or more can be acquired compared to the conventional PWM driving method.

Further, according to the present disclosure, since a scan time that is at least twice as long as that of the conventional PWM driving method can be secured, there is an advantage in that a gray scale can be easily implemented by the sub-frames.

In addition, according to the present disclosure, since a current level of a low gray scale is raised 10 times or more for driving compared to the conventional PWM driving method, it becomes robust against noise, a leakage current, and stress, and accordingly, the low gray scale can be easily implemented in a display device and reliability of low gray scale implementation can be improved.

In addition, according to the present disclosure, since a required data voltage level can be lowered to a level of approximately 1/10 compared to the conventional PWM driving method, an area of a data driver can be greatly reduced to a level of approximately 1/10, and accordingly, there is an advantage in that a display module can be miniaturized.

DETAILED DESCRIPTION OF THE EMBODIMENTS

Figure 1:
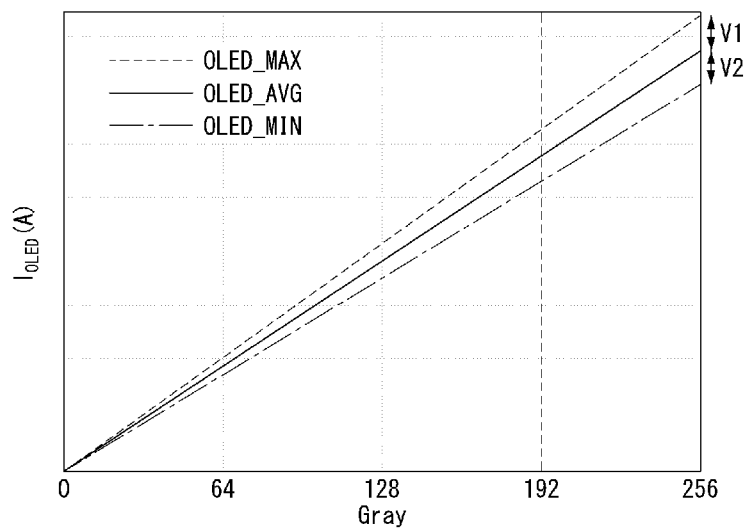
FIG. 1 is an exemplary diagram illustrating a general OLED deviation.

Exemplary embodiments of the present disclosure are disclosed herein. However, specific structural and functional details disclosed herein are merely representative for purposes of describing exemplary embodiments of the present disclosure. Thus, exemplary embodiments of the present disclosure may be embodied in many alternate forms and should not be construed as limited to exemplary embodiments of the present disclosure set forth herein.

Accordingly, while the present disclosure is capable of various modifications and alternative forms, specific exemplary embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular exemplary embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings. In order to facilitate general understanding in describing the present disclosure, the same components in the drawings are denoted with the same reference signs, and repeated description thereof will be omitted.

Figure 2:
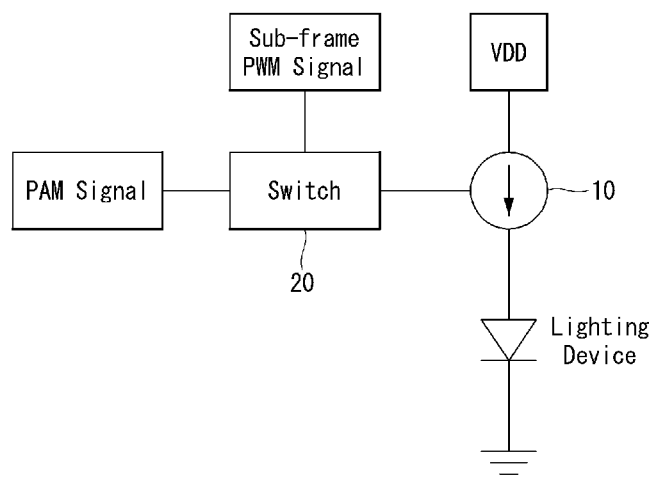
FIG. 2 is a schematic diagram for describing a pixel circuit driving method (hereinafter, briefly referred to as 'a hybrid driving method') according to one embodiment of the present disclosure.

FIG. 2 is a schematic diagram for describing a pixel circuit driving method (hereinafter, briefly referred to as 'a hybrid driving method') according to one embodiment of the present disclosure.

Referring to FIG. 2, the hybrid driving method provides a new luminance control method of a pixel circuit which supplies a driving current to a light-emitting element (lighting device) such as a light-emitting diode (LED), an organic LED (OLED), a quantum dot LED (QLED), or the like.

The hybrid driving method is configured to supply a current corresponding to a desired luminance or gray scale for a light-emitting element connected in series with a current source 10 between a first power supply voltage VDD and a second power supply voltage. The current source 10 may include a driving transistor or a configuration which performs the same function. The driving transistor may include a thin film transistor. Further, the second power supply voltage may include a ground potential.

To this end, in the hybrid driving method, a switch 20 which adjusts a signal level for controlling the current source 10 is provided. The switch may include a semiconductor transistor or a thin film transistor.

The switch 20 may be configured to perform a turn-on operation for a predetermined time determined according to a sub-frame pulse width modulation (PWM) signal (hereinafter, briefly referred to as 'a PWM signal') having a plurality of sub-frames during one frame or one frame time for driving the light-emitting element once.

Further, the switch 20 may be configured to apply any one pulse amplitude modulation (PAM) signal selected from a plurality of different PAM signals to the current source 10 for a predetermined time according to the pulse width modulation (PWM) signal.

The PAM signal is a data signal, and is used to control the operation of the current source 10 so that the current source 10 supplies a current having an intensity or level corresponding to a specific luminance or gray scale to the light-emitting element.

The above-described switch 20 is the simplest and most suitable means for controlling the current source 10, and may be variously modified or replaced with another switch circuit, a control signal generation circuit, or a control structure when the operation of the above-described switch 20 can be performed.

Figure 3:
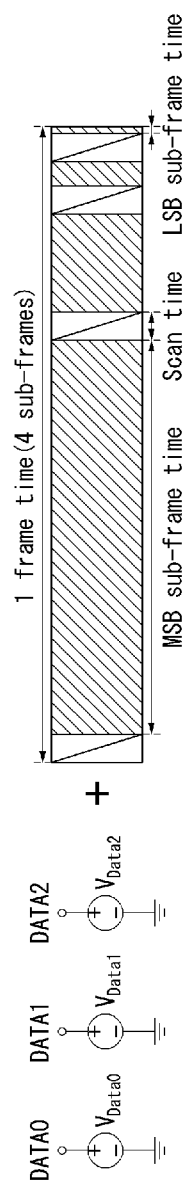
FIG. 3 is a view for describing a basic driving principle which may be employed in the hybrid driving method of the embodiment.

FIG. 3 is a view for describing a basic driving principle which may be employed in the hybrid driving method of the embodiment.

Referring to FIG. 3, the hybrid driving method is configured so that the switch (see 20 in FIG. 2) of a pixel circuit coupled to the light emitting element operates by three PAM driving current levels and a PWM signal having four sub-frames in a single frame, for example, a PWM switching control signal. Here, each of the four sub-frames may have a PWM signal form in which any one of the three PAM driving current levels is selected. In this case, the hybrid driving method may express a specific gray scale of a ternary number determined by the sum of products of the three PAM driving current levels and the four sub-frames of the PWM signal.

The three PAM driving current levels may be generated to correspond to data voltages $V_{Data0}$, $V_{Data1}$, and $V_{Data2}$ respectively applied to a first terminal of the switch by three data sources DATA0, DATA1, and DATA2 by the data driver. The data voltages $V_{Data0}$, $V_{Data1}$, and $V_{Data2}$ of different levels may be generated and supplied by the data driver which applies a predetermined voltage, a current, or a data signal through at least one specific data line connected to the first terminal of the switch.

The four sub-frames may be configured in a binary weighted form. For example, the four sub-frames may be configured so that a time corresponding to a power of 2 sequentially increases based on a sub-frame of the least significant bit (LSB) within a single frame time. In this case, a sub-frame of the most significant bit (MSB) in a single frame may have a sub-frame time of $2^3$, and a sub-frame of the least significant bit may have a sub-frame time of $2^0$. A scan time may be disposed between each of the four sub-frames, but the scan time may overlap the sub-frame time according to a driving method. The plurality of sub-frames may be generated and supplied by a scan driver which applies a predetermined voltage, a current, or a scan signal through at least one specific scan line connected to a control terminal of the switch.

Figure 25:
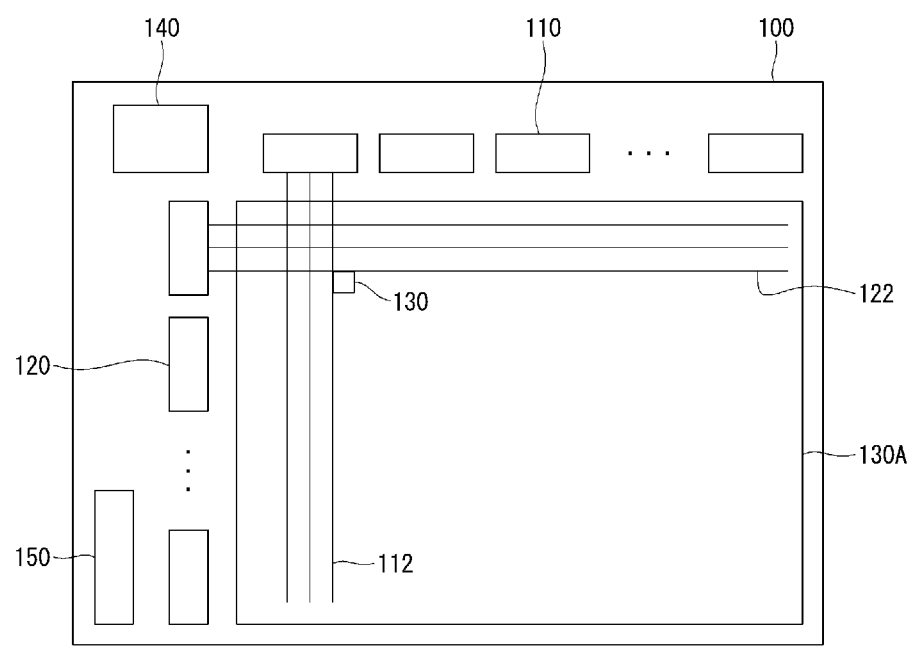
FIG. 25 is a schematic block diagram of a display module using the hybrid driving method of the embodiment.

The above-described data driver and scan driver may be partial configurations of a display module (see 100 in FIG. 25). The display module may include a pixel unit (see 130A in FIG. 25) in which a plurality of pixel circuits 130 operated by the data driver and the scan driver are arranged in a matrix form. Further, the first terminal of the switch of the pixel circuit is connected to the data line connected to the data driver, the control terminal of the switch is connected to the scan line connected to the scan driver, and a second terminal of the switch is connected to the current source (see 10 in FIG. 2) which supplies a current corresponding to a desired gray scale to the light-emitting element. The current source is referred to as a driving transistor, and may include a thin film transistor structure.

Like the above, according to the embodiment, in a pixel circuit including two transistors and one capacitor or the like, a desired gray scale may be effectively expressed while minimizing the influence of a characteristic deviation of the driving transistor.

Meanwhile, in the embodiment, although the plurality of PAM signal levels applied to the first terminal of the switch of the pixel circuit through the data line are described as three levels, and the plurality of PWM sub-frames applied to the control terminals of the switch through the scan line are described as four sub-frames, the present disclosure is not limited to this configuration, and it may be configured using at least two or more PAM signal levels and at least two or more sub-frames.

Figure 4A:
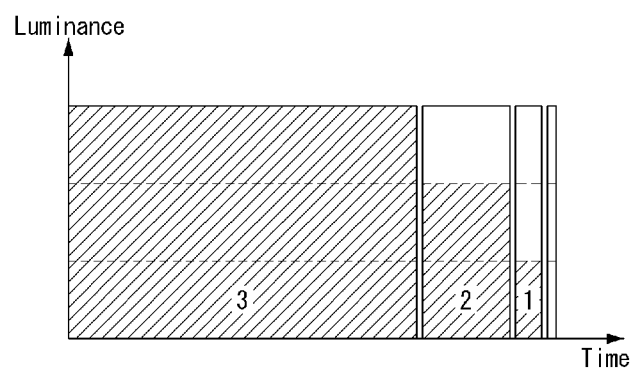
FIGS. 4A and 4B are views for describing a first driving principle which may be employed in the hybrid driving method of the embodiment.
Figure 4B:
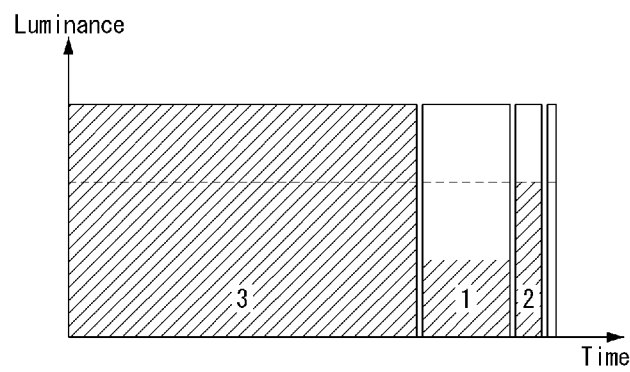
Figure 5:
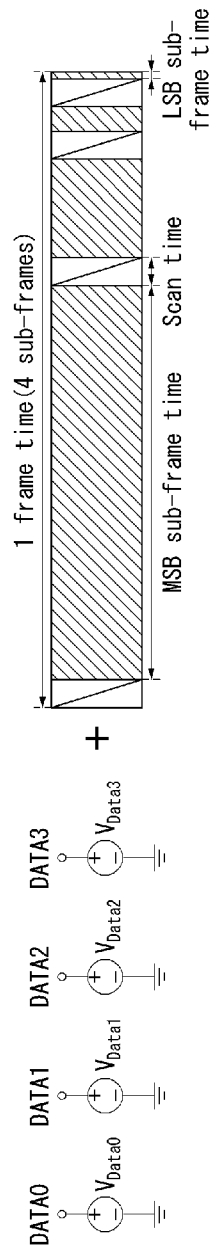
FIG. 5 is an exemplary diagram schematically illustrating PWM driving sub-frames and PAM driving current levels used in the first driving principle in FIGS. 4A and 4B.

FIGS. 4A and 4B are views for describing a first driving principle which may be employed in the hybrid driving method of the embodiment. FIG. 5 is an exemplary diagram schematically illustrating PWM driving sub-frames and PAM driving current levels used in the first driving principle in FIGS. 4A and 4B.

Referring to FIGS. 4A and 4B, the hybrid driving method may be configured to apply any one PAM signal selected from four pulse amplitude modulation (PAM) signal levels to a control terminal of the driving transistor at each switch turn-on timing according to the PWM signals corresponding to four sub-frames in the single frame to control the current source to make the light-emitting element express a specific luminance or gray scale.

For example, as shown in FIG. 4A, hybrid driving may be performed with 3210 in a quaternary number to express 11100100 in general digital driving. In this case, the hybrid driving method may control the current source by the sum of a PAM signal having a magnitude of level 3 for a sub-frame time of the most significant bit (MSB sub-frame time), a PAM signal having a magnitude of level 2 for a second sub-frame time, a PAM signal having a magnitude of level 1 for a third sub-frame time, and a PAM signal having a magnitude of level 0 for a sub-frame time of the least significant bit (LSB sub-frame time).

Further, for example, as shown in FIG. 4B, hybrid driving may be performed with 3120 in a quaternary number to express 11011000 in the general digital driving. In this case, the hybrid driving method may control the current source by the sum of a PAM signal having a magnitude of level 3 for the MSB sub-frame time, a PAM signal having a magnitude of level 1 for the second sub-frame time, a PAM signal having a magnitude of level 2 for the third sub-frame time, and a PAM signal having a magnitude of level 0 for the LSB sub-frame time.

As shown in FIG. 5, the above-described hybrid driving method may correspond to a PWM driving method having driving current levels respectively corresponding to four PAM signal levels DATA0, DATA1, DATA2, and DATA3 in four sub-frames in the single frame. In this case, the hybrid driving method may effectively express a desired gray scale among gray scales of 8-bits by the sub-frames of the PWM signal having four sub-frames and the PAM signal levels having four driving voltage levels or four driving current levels.

Figure 6A:
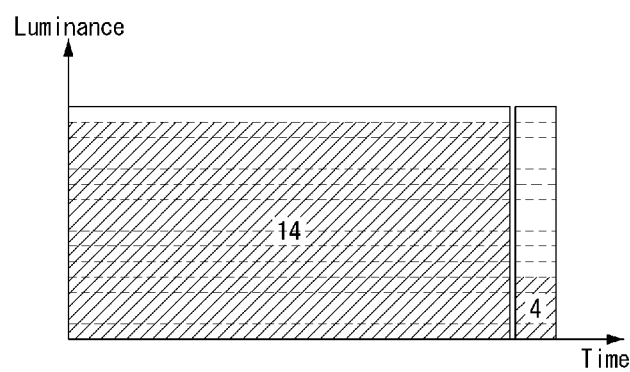
FIGS. 6A and 6B are views for describing a second driving principle which may be employed in the hybrid driving method of the embodiment.
Figure 6B:
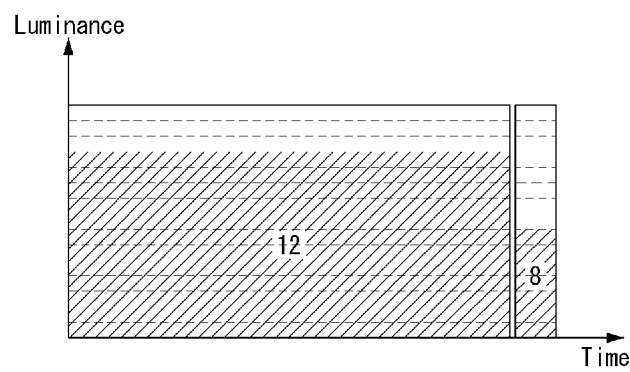
Figure 7:
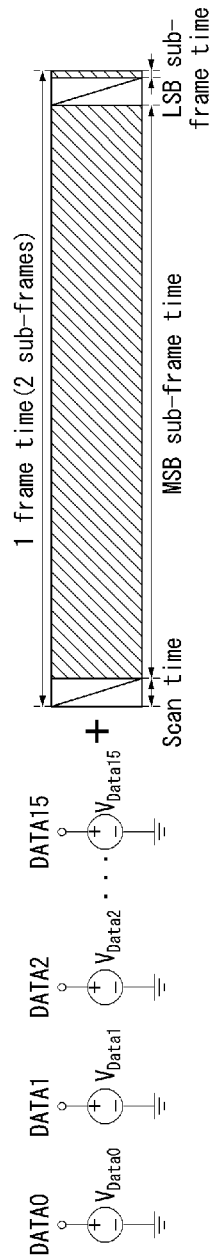
FIG. 7 is an exemplary diagram schematically illustrating PWM driving sub-frames and PAM driving current levels used in the second driving principle in FIGS. 6A and 6B.

FIGS. 6A and 6B are views for describing a second driving principle which may be employed in the hybrid driving method of the embodiment. FIG. 7 is an exemplary diagram schematically illustrating PWM driving sub-frames and PAM driving current levels used in the second driving principle in FIGS. 6A and 6B.

Referring to FIGS. 6A and 6B, the hybrid driving method may be configured to respectively apply two PAM signal levels selected from at least 16 different pulse amplitude modulation (PAM) signals to sub-frames of the PWM signals having two sub-frames in the single frame to control the current source to make the light-emitting element express a luminance or gray scale of a specific bit. Here, the two specific PAM signal levels selected from the PAM signal levels may be applied to the first terminal of the switch during the two sub-frames in the single frame of the PWM signal, respectively. The second terminal of the switch is connected to the control terminal of the driving transistor which supplies a current corresponding to a desired gray scale to the light-emitting element, and the PWM signal is applied to the control terminal of the switch.

In the above, for example, as shown in FIG. 6A, hybrid driving may be performed with 14 and 4 in a hexadecimal number to express 11100100 in general digital driving. In this case, the hybrid driving method may be configured to respectively apply a PAM signal having a magnitude of level 14 for the MSB sub-frame time and a PAM signal having a magnitude of level 4 for the LSB sub-frame time for two sub-frames in the single frame to the current source, that is, the control terminal of the driving transistor through the switch, to control the current flowing through the driving transistor.

Further, for example, as shown in FIG. 6B, hybrid driving may be performed with 12 and 8 in a hexadecimal number to express 11011000 in the general digital driving. In this case, the hybrid driving method may be configured to respectively apply a PAM signal having a magnitude of level 12 for the first sub-frame time or MSB sub-frame time and a PAM signal having a magnitude of level 8 for the second sub-frame time or LSB sub-frame time for two sub-frames in the single frame of the scan time to the current source, that is, the control terminal of the driving transistor through the switch, to control the current flowing through the driving transistor.

Here, each of the two sub-frames composed of the MSB sub-frame and the LSB sub-frame may respectively have weights for the sub-frame time lengths of 16 ($16^1$) and 1 ($16^0$) in the order of being disclosed. Further, the PAM signal used for the hybrid driving method may have 16 signal levels of levels 0 to 15.

As shown in FIG. 7, the above-described hybrid driving method may be configured to use PWM signal having 16 PAM driving voltage levels ($V_{DATA0}$, $V_{DATA1}$, $V_{DATA2}$, ..., $V_{DATA15}$) and two sub-frames. Like the above, the hybrid driving method may be configured so that the pixel circuit which drives the light-emitting element uses the 16 PAM driving voltage levels and the two sub-frames of the PWM signal to uniformly display, for example, a desired gray scale among the gray scales of 8-bits while minimizing the influence of a characteristic deviation of the driving transistor.

Hereinafter, a general digital driving method will be described as follows in comparison with the hybrid driving method of any one of a ternary number to a hexadecimal number of the embodiment.

Figure 8:
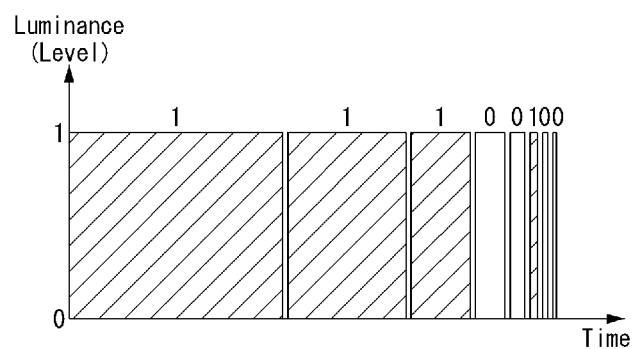
FIG. 8 is a view for describing a digital driving method of a comparative example.

FIG. 8 is a view for describing a digital driving method of a comparative example.

Referring to FIG. 8, for example, the digital driving method of the comparative example may be configured to express each of the MSB sub-frame and second to fourth and sixth sub-frames among eight sub-frames as level 1, and express each of the remaining fifth and seventh sub-frames and the LSB sub-frame as level 0 to express a specific gray scale corresponding to 11100100 in a binary number among the 8-bit gray scale. Here, the eight sub-frames for 8-bit gray scale expression respectively have weights for sub-frame time lengths of 128 ($2^7$), 64 ($2^6$), 32 ($2^5$), 16 ($2^4$), 8 ($2^3$), 4 ($2^2$), 2 ($2^1$), and 1 ($2^0$) in the order of being disclosed from the MSB sub-frame to the LSB sub-frame.

Like the above, the digital driving method of the comparative example corresponds to applying a data signal of a single level 1 preset in the MSB sub-frame and the second to fourth and sixth sub-frames among the eight sub-frames to the control terminal of the driving transistor to express a specific gray scale or luminance corresponding to the 11100100 in a binary number among the 8-bit gray scale.

Figure 9:
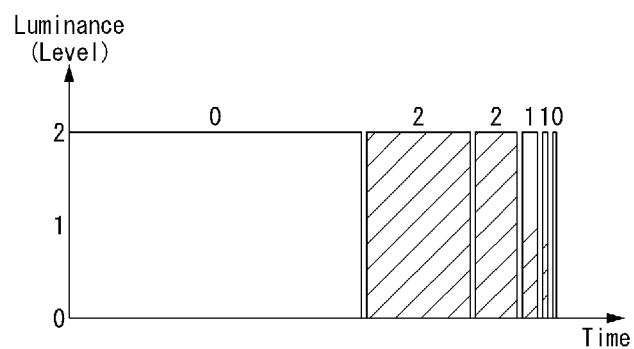
FIG. 9 is a view for describing a ternary number-based third driving principle which may be employed in the hybrid driving method of the embodiment.

FIG. 9 is a view for describing a ternary number-based third driving principle which may be employed in the hybrid driving method of the embodiment.

Referring to FIG. 9, in the hybrid driving method, for six sub-frames in the single frame, a PAM signal having a magnitude of level 0 in the MSB sub-frame, a PAM signal of level 2 in the second sub-frame, a PAM signal of level 2 in the third sub-frame, a PAM signal of level 1 in the fourth sub-frame, a PAM signal of level 1 in the fifth sub-frame, and a PAM signal of level 0 in the LSB sub-frame may be respectively applied to the current source, that is, the control signal of the driving transistor, through the switch to express a gray scale of 022110 in a ternary number corresponding to 228 in a decimal number or 11100100 in a binary number. Accordingly, the driving transistor may operate so that a current corresponding to the specific gray scale flows through the light-emitting element.

Here, the six sub-frames in the single frame used in the hybrid driving method may respectively have weights for sub-frame time lengths of 243 ($3^5$), 81 ($3^4$), 27 ($3^3$), 9 ($3^2$), 3 ($3^1$), and 1 ($3^0$) in the order of being disclosed from the MSB sub-frame to the LSB sub-frame. Further, the PAM signal used in the hybrid driving method may have three signal levels of level 0, level 1, and level 2.

Figure 10:
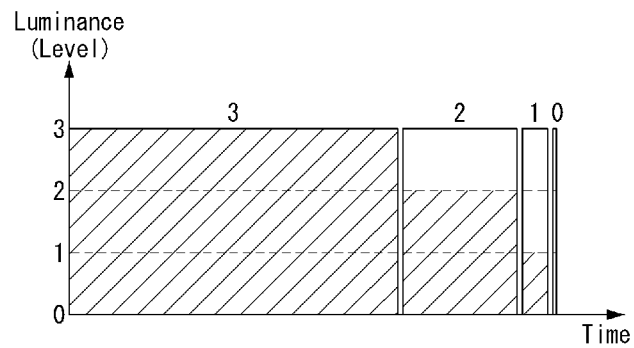
FIG. 10 is a view for describing a quaternary number-based fourth driving principle which may be employed in the hybrid driving method of the embodiment.

FIG. 10 is a view for describing a quaternary number-based fourth driving principle which may be employed in the hybrid driving method of the embodiment.

Referring to FIG. 10, in the hybrid driving method, for four sub-frames in the single frame, a PAM signal having a magnitude of level 3 in the MSB sub-frame, a PAM signal of level 2 in the second sub-frame, a PAM signal of level 1 in the third sub-frame, and a PAM signal of level 0 in the LSB sub-frame may be respectively applied to the control terminal of the driving transistor through the switch to express a gray scale of 3210 in a quaternary number corresponding to 228 in a decimal number or 11100100 in a binary number.

Here, the four sub-frames in the single frame used in the hybrid driving method may respectively have weights for sub-frame time lengths of 64 ($4^3$), 16 ($4^2$), 4 ($4^1$), and 1 ($4^0$) in the order of being disclosed from the MSB sub-frame to the LSB sub-frame. Further, the PAM signal used in the hybrid driving method may have four signal levels of level 0, level 1, level 2, and level 3.

Figure 11:
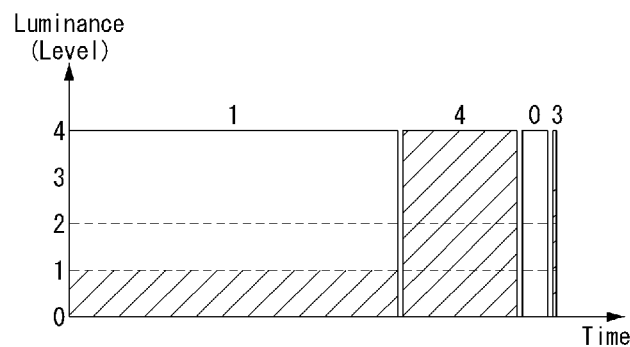
FIG. 11 is a view for describing a quinary number-based fifth driving principle which may be employed in the hybrid driving method of the embodiment.

FIG. 11 is a view for describing a quinary number-based fifth driving principle which may be employed in the hybrid driving method of the embodiment.

Referring to FIG. 11, in the hybrid driving method, for four sub-frames in the single frame, a PAM signal having a magnitude of level 1 in the MSB sub-frame, a PAM signal of level 4 in the second sub-frame, a PAM signal of level 0 in the third sub-frame, and a PAM signal of level 3 in the LSB sub-frame may be respectively applied to the control terminal of the driving transistor through the switch to express a gray scale of 1403 in a quinary number corresponding to 228 in a decimal number or 11100100 in a binary number.

Here, the four sub-frames in the single frame used in the hybrid driving method may respectively have weights for sub-frame time lengths of 125 ($5^3$), 25 ($5^2$), 5 ($5^1$), and 1 ($5^0$) in the order of being disclosed from the MSB sub-frame to the LSB sub-frame. Further, the PAM signal used in the hybrid driving method may have five signal levels of level 0, level 1, level 2, level 3, and level 4

Figure 12:
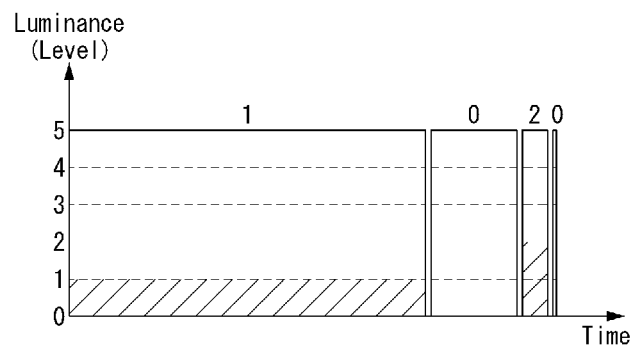
FIG. 12 is a view for describing a senary number-based sixth driving principle which may be employed in the hybrid driving method of the embodiment.

FIG. 12 is a view for describing a senary number-based sixth driving principle which may be employed in the hybrid driving method of the embodiment.

Referring to FIG. 12, in the hybrid driving method, for four sub-frames in the single frame, a PAM signal having a magnitude of level 1 in the MSB sub-frame, a PAM signal of level 0 in the second sub-frame, a PAM signal of level 2 in the third sub-frame, and a PAM signal of level 0 in the LSB sub-frame may be respectively applied to the control terminal of the driving transistor through the switch to express a gray scale of 1020 in a senary number corresponding to 228 in a decimal number or 11100100 in a binary number.

Here, the four sub-frames in the single frame used in the hybrid driving method may respectively have weights for sub-frame time lengths of 216 ($6^3$), 36 ($6^2$), 6 ($6^1$), and 1 ($6^0$) in the order of being disclosed from the MSB sub-frame to the LSB sub-frame. Further, the PAM signal used in the hybrid driving method may have six signal levels of levels 0 to 5.

Figure 13:
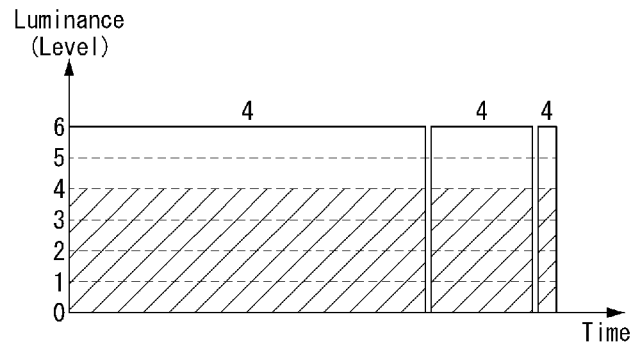
FIG. 13 is a view for describing a septenary number-based seventh driving principle which may be employed in the hybrid driving method of the embodiment.

FIG. 13 is a view for describing a septenary number-based seventh driving principle which may be employed in the hybrid driving method of the embodiment.

Referring to FIG. 13, in the hybrid driving method, for three sub-frames in the single frame, a PAM signal having a magnitude of level 4 in the MSB sub-frame, a PAM signal of level 4 in the second sub-frame, and a PAM signal of level 4 in the LSB sub-frame may be respectively applied to the control terminal of the driving transistor through the switch to express a gray scale of 444 in a septenary number corresponding to 228 in a decimal number or 11100100 in a binary number.

Here, the three sub-frames in the single frame used in the hybrid driving method may respectively have weights for sub-frame time lengths of 49 ($7^2$), 7 ($7^1$), and 1 ($7^0$) in the order of being disclosed from the MSB sub-frame to the LSB sub-frame. Further, the PAM signal used in the hybrid driving method may have seven signal levels of levels 0 to 6.

Meanwhile, in the hybrid driving method, three sub-frames in the single frame may be used to express a specific gray scale of an octal number, and the sub-frames may respectively have weights for sub-frame time lengths of 64 ($8^2$), 8 ($8^1$), and 1 ($8^0$) in the order of being disclosed from the MSB sub-frame to the LSB sub-frame. Further, the PAM signal used in the hybrid driving method may have eight signal levels of levels 0 to 7.

In addition, in the hybrid driving method, three sub-frames in the single frame may be used to express a specific gray scale of a nonary number, and the sub-frames may respectively have weights for sub-frame time lengths of 81 ($9^2$), 9 ($9^1$), and 1 ($9^0$) in the order of being disclosed from the MSB sub-frame to the LSB sub-frame. In addition, the PAM signal used in the hybrid driving method may have nine signal levels of levels 0 to 8.

In addition, in the hybrid driving method, three sub-frames in the single frame may be used to express a specific gray scale of a decimal number, and the sub-frames may respectively have weights for sub-frame time lengths of 100 ($10^2$), 10 ($10^1$), and 1 ($10^0$) in the order of being disclosed from the MSB sub-frame to the LSB sub-frame. In addition, the PAM signal used in the hybrid driving method may have ten signal levels of levels 0 to 9.

In addition, in the hybrid driving method, three sub-frames in the single frame may be used to express a specific gray scale of an undecimal number, and the sub-frames may respectively have weights for sub-frame time lengths of 121 ($11^2$), 11 ($11^1$), and 1 ($11^0$) in the order of being disclosed from the MSB sub-frame to the LSB sub-frame. In addition, the PAM signal used in the hybrid driving method may have eleven signal levels of levels 0 to 10.

In addition, in the hybrid driving method, three sub-frames in the single frame may be used to express a specific gray scale of a duodecimal number, and the sub-frames may respectively have weights for sub-frame time lengths of 144 ($12^2$), 12 ($12^1$), and 1 ($12^0$) in the order of being disclosed from the MSB sub-frame to the LSB sub-frame. In addition, the PAM signal used in the hybrid driving method may have twelve signal levels of levels 0 to 11.

In addition, in the hybrid driving method, three sub-frames in the single frame may be used to express a specific gray scale of a tridecimal number, and the sub-frames may respectively have weights for sub-frame time lengths of 169 ($13^2$), 13 ($13^1$), and 1 ($13^0$) in the order of being disclosed from the MSB sub-frame to the LSB sub-frame. In addition, the PAM signal used in the hybrid driving method may have thirteen signal levels of levels 0 to 12.

In addition, in the hybrid driving method, three sub-frames in the single frame may be used to express a specific gray scale of a tetradecimal number, and the sub-frames may respectively have weights for sub-frame time lengths of 196 ($14^2$), 14 ($14^1$), and 1 ($14^0$) in the order of being disclosed from the MSB sub-frame to the LSB sub-frame. In addition, the PAM signal used in the hybrid driving method may have fourteen signal levels of levels 0 to 13.

In addition, in the hybrid driving method, three sub-frames in the single frame may be used to express a specific gray scale of a pentadecimal number, and the sub-frames may respectively have weights for sub-frame time lengths of 225 ($15^2$), 15 ($15^1$), and 1 ($15^0$) in the order of being disclosed from the MSB sub-frame to the LSB sub-frame. In addition, the PAM signal used in the hybrid driving method may have fifteen signal levels of levels 0 to 14.

In addition, for the hybrid driving method of expressing a specific gray scale of a hexadecimal number, reference may be made to FIGS. 6A and 6B and the corresponding detailed descriptions.

As described above, the hybrid driving method combines PAM driving and PWM driving in a unique way to effectively express 256 gray levels of 8-bits while minimizing the influence due to the characteristic deviation of the driving transistor.

Each of the number of sub-frames and a sub-frame length ratio in the hybrid driving method which expresses the specific gray scale in the above-described embodiment, for example, the gray scale of 228 in a decimal number or 11100100 in a binary number is shown in Table 1 below compared to the comparative example.

TABLE 1

| | Base notation | Data representation | Number of sub-frames | Sub-frame length ratio | corresponding decimal value |
|---|---|---|---|---|---|
| Comparative example | 2 | 11100100 | 8 | 128:64:32:16:8:4:2:1 | 228 |
| The embodiment | 3 | 022110 | 6 | 81:27:9:6.5:3:1 | 228 |
| | 4 | 3210 | 4 | 64:16:4:1 | 228 |
| | 5 | 1403 | 4 | 32.75:25:5:1 | 228 |
| | 6 | 1020 | 4 | 36:8:6:1 | 228 |
| | 7 | 444 | 3 | 34.5:7:1 | 228 |
| | 8 | 344 | 3 | 27.42:8:1 | 228 |
| | 9 | 273 | 3 | 18.33:9:1 | 228 |
| | 10 | 228 | 3 | 17.34:9:1 | 228 |
| | 11 | 198 | 3 | (omitted) | 228 |
| | 12 | 170 | 3 | (omitted) | 228 |
| | 13 | 147 | 3 | (omitted) | 228 |
| | 14 | 124 | 3 | (omitted) | 228 |
| | 15 | 103 | 3 | (omitted) | 228 |
| | 16 | E4 | 2 | (omitted) | 228 |

However, the length ratio of the sub-frame of a method of expressing each of the plurality of levels corresponding to each base notation is not limited to the embodiment of Table 1, and may be variously modified and generated in the levels of other base notations except for 4 levels of quaternary numbers and 16 levels of hexadecimal numbers.

Figure 14:
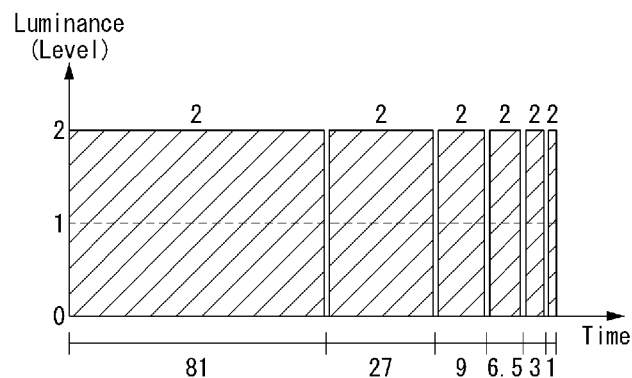
FIGS. 14 to 16 are views for describing a modification (an eighth driving principle) of a ternary number-based fourth driving principle which may be employed in the hybrid driving method of the embodiment.
Figure 15:
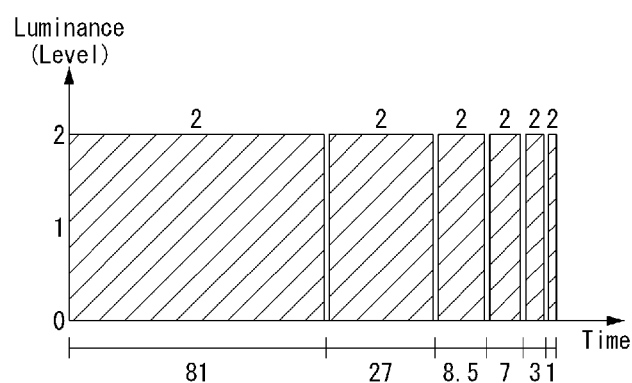
Figure 16:
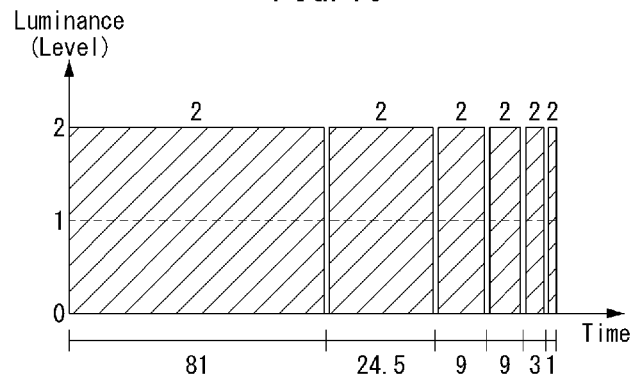

FIGS. 14 to 16 are views for describing a modification (an eighth driving principle) of a ternary number-based fourth driving principle which may be employed in the hybrid driving method of the embodiment.

Referring to FIGS. 14 to 16, in the hybrid driving method using a ternary number or 3-level representation method, the length ratio or weight of three sub-frames used to express a 255 level gray scale of a ternary number based on 8-bit 256 gray scale may be used by selecting any one of [81:27:9: 6.5:3:1], [81:27:8.5:7:3:1], and [81:24.5:9:9:3:1].

Although the above-described hybrid driving method according to the embodiment may implement a hexadecimal number or higher, since the implementation of the hexadecimal number or higher is not effective for expressing the 8-bit gray scale, a description thereof will be omitted. Meanwhile, the implementation of the hexadecimal number or higher is effective for expressing a 10-bit 1024 gray scale, a 12-bit 4096 gray scale, and the like.

Figure 17:
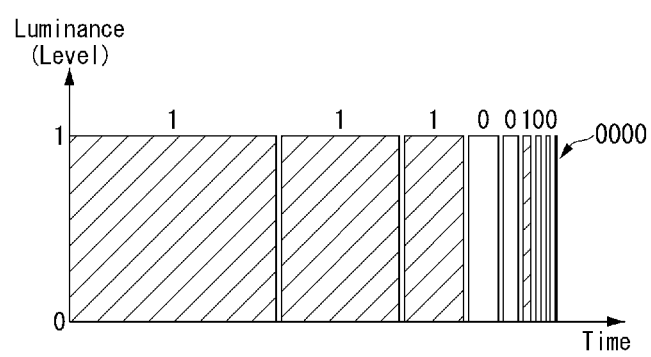
FIG. 17 is an exemplary diagram illustrating a 12-bit-based digital driving method of the comparative example.
Figure 18:
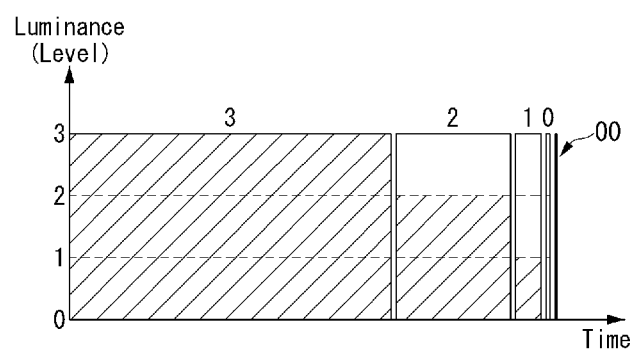
FIG. 18 is an exemplary diagram for describing a 12-bit based ninth driving principle which may be employed in the hybrid driving method of the embodiment.

FIG. 17 is an exemplary diagram illustrating a 12-bit-based digital driving method of the comparative example. FIG. 18 is an exemplary diagram for describing a 12-bit based ninth driving principle which may be employed in the hybrid driving method of the embodiment.

As shown in FIG. 17, the 12-bit based digital driving method of the comparative example is configured to dispose twelve sub-frames in the single frame, and to apply or not to apply a signal corresponding to a luminance of level 1 to each sub-frame to express a specific gray scale of a binary number. For example, the 12-bit digital driving method of the comparative example is configured to apply a data signal corresponding to the luminance of level 1 only in the MSB sub-frame, and the second, third, and sixth sub-frames to express a gray scale of 111001000000 in a binary number to the control terminal of the driving transistor.

Accordingly, the 12-bit-based digital driving method of the comparative example may show a problem in that a gray scale of uniform luminance is not properly expressed in a low gray scale operation of a gray scale controlled by only the LSB sub-frame, a gray scale controlled by only the LSB sub-frame and the eleventh sub-frame, or the like due to the characteristic deviation of the driving transistor.

Meanwhile, as shown in FIG. 18, in the 12-bit-based digital driving method according to the embodiment, for six sub-frames in the single frame, a PAM signal having a magnitude of level 3 in the MSB sub-frame, a PAM signal of level 2 in the second sub-frame, a PAM signal of level 1 in the third sub-frame, a PAM signal of level 0 in the fourth sub-frame, a PAM signal of level 0 in the fifth sub-frame, and a PAM signal of level 0 in the LSB sub-frame may be sequentially applied to the control terminal of the driving transistor through the switch to express a gray scale of 2140 in a duodecimal number corresponding to 3648 in a decimal number or 111001000000 in a binary number.

Here, in the six sub-frames in the single frame used in the 12-bit based hybrid driving method, weights for sub-frame time lengths have values in which a power of a predetermined value linearly decreases from the MSB sub-frame to the LSB sub-frame. Further, the PAM signal used in the hybrid driving method may have four signal levels of levels 0 to 3.

Like the above, in the hybrid driving method according to the embodiment, since the time of the LSB sub-frame is increased using a number of sub-frames smaller than the number of sub-frames of the digital driving method of the comparative example, a low gray scale current 10 times or more compared to the comparative example is controlled to flow through the driving transistor when level 1 gray is expressed, and thus it is possible to have a characteristic of being robust against noise, a leakage current, stress, and the like.

Figure 19:
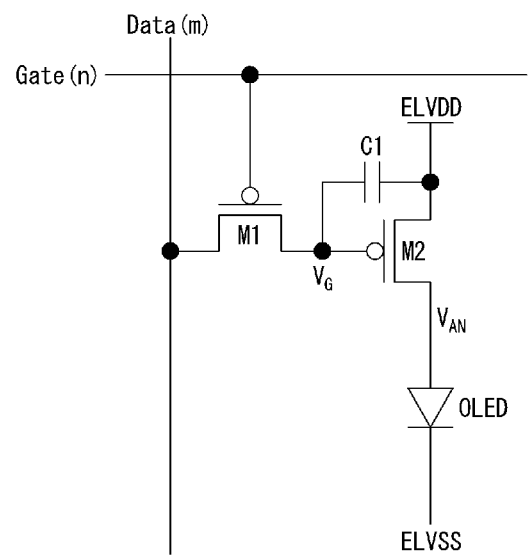
FIG. 19 is a circuit diagram of a pixel circuit to which the hybrid driving method of the embodiment is applicable.

FIG. 19 is a circuit diagram of a pixel circuit to which the hybrid driving method of the embodiment is applicable.

Referring to FIG. 19, the pixel circuit applicable to the hybrid driving method may include a structure including two transistors M1 and M2 and one capacitor C1. Among the two transistors, a first transistor M1 may correspond to a switching thin film transistor, and a second transistor M2 may correspond to a driving transistor or driving thin film transistor for controlling a current amount of a light-emitting element such as an organic light-emitting diode (OLED). Further, one capacitor C1 maintains a data voltage applied to a control terminal of the second transistor M2 through the first transistor M1 for a single frame.

In the pixel circuit, a first terminal of the first transistor M1 is connected to an m-th data line data (m), a control terminal (hereinafter, also referred to as a first control terminal) of the first transistor M1 is connected to an n-th gate line gate (n) line or a scan line, and a second terminal of the first transistor M1 is commonly connected to the control terminal (hereinafter, also referred to as a second control terminal) of the driving transistor M2 and a second terminal of the capacitor C1. The m and n are arbitrary natural numbers. A common connection node has a predetermined voltage $V_G$.

Further, a first terminal of the driving transistor M2 is commonly connected to a first power supply voltage ELVDD and the second terminal of the capacitor C1, and a second terminal of the driving transistor M2 is connected to a first terminal of the light-emitting element such as an anode of the organic light emitting diode (OLED). A second terminal of the light-emitting element is connected to a second power supply voltage ELVSS or the ground.

The above-described pixel circuit operates to apply any one of a plurality of PAM signal levels determined for each sub-frame of a PWM signal to the second control terminal of the driving transistor M2 through the first transistor M1 for a time determined by the PWM signals for a plurality of sub-frames in a single frame to express a desired gray scale.

The pixel circuit of the above-described configuration may be driven in a display period separated (DPS) method. DSP driving operates so that a scan time and an emission time of the light-emitting element do not overlap and are separated, and the emission time of the light-emitting element is relatively short compared to a simultaneous erasing scan (SES) driving method in which the scan time and the emission time overlap each other.

Like the above, the hybrid driving method according to the embodiment may also be effectively applied to the most simplified pixel circuit for driving light-emitting elements such as an LED, an OLED, a QLED, and the like. That is, the hybrid driving method of the embodiment may effectively solve a problem in that brightness non-uniformity of a display device is caused by generating an error of approximately 10% in low gray scale expression by a conventional pixel circuit driving method applied to the pixel circuit having the same configuration. Further, according to the present disclosure, since power required for an N-bit sub-frame is increased several times, implementation of the sub-frame is facilitated, and the driving transistor, which is a current source, is used as the switch, it is possible to effectively compensate for a deviation of the light-emitting element by fixing an anode voltage of the light-emitting element to be substantially constant.

Figure 20:
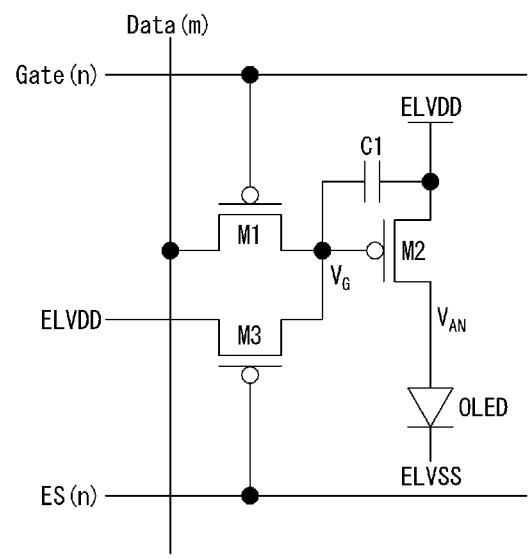
FIG. 20 is a circuit diagram of another pixel circuit to which the hybrid driving method of the embodiment is applicable.

FIG. 20 is a circuit diagram of another pixel circuit to which the hybrid driving method of the embodiment is applicable.

Referring to FIG. 20, the pixel circuit applicable to the hybrid driving method may include a structure including three transistors M1, M2, and M3 and one capacitor C1.

In the pixel circuit, a first terminal of a first transistor M1 is connected to an m-th data line data (m), a first control terminal of the first transistor M1 is connected to an n-th gate line gate (n) line or a scan line, and a second terminal of the first transistor M1 is commonly connected to a control terminal of a driving transistor M2 and a second terminal of the capacitor C1.

A first terminal of the driving transistor M2 is commonly connected to a first power supply voltage ELVDD and the second terminal of the capacitor, and a second terminal of the driving transistor M2 is connected to a first terminal of a light-emitting element such as an anode of an organic light emitting diode (OLED). A second terminal of the light-emitting element is connected to a second power supply voltage ELVSS or the ground. The driving transistor M2 may be referred to as a second transistor.

Further, a first terminal of a third transistor M3 is connected to the first power supply voltage ELVDD, a control terminal (hereinafter, also referred to as a third control terminal) of the third transistor M3 is connected to an n-th erasing line ES(n) or erasing wiring, and a second terminal of the third transistor M3 is commonly connected to the second terminal of the first transistor M1, the control terminal of the driving transistor M2, and the second terminal of the capacitor C1.

The pixel circuit of the above-described configuration may be driven in a simultaneous erasing scan (SES) method. SES driving operates so that an emission time and a scan time overlap each other by an erasing operation through the third transistor M3 according to the lengths of the emission time and the scan time of the light-emitting element, and the emission time of the light-emitting element is relatively short compared to the DPS method.

Like the above, the hybrid driving method according to the embodiment may also be effectively applied to a pixel circuit of three transistors and one capacitor (3T1C) for driving light-emitting elements such as an LED, an OLED, a QLED, and the like. That is, in the hybrid driving method of the embodiment, compared to the conventional pixel circuit driving method applied to the pixel circuit having the same configuration, since power required for an N-bit sub-frame is increased several times while removing an error in low gray scale expression, implementation of the sub-frame is facilitated, and the driving transistor is used as a switch, it is possible to effectively compensate for a deviation of the light-emitting element by fixing an anode voltage of the light-emitting element to be substantially constant.

Figure 21:
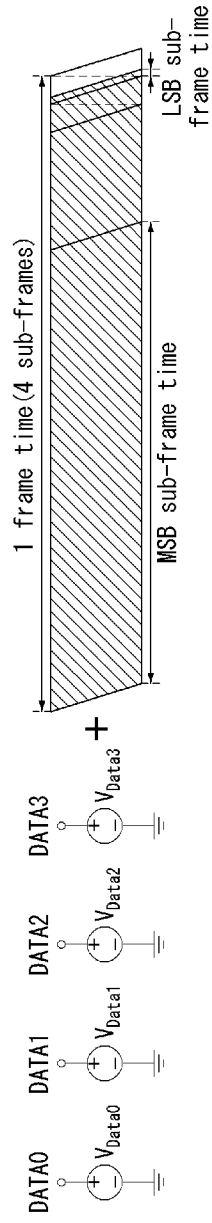
FIG. 21 is an exemplary diagram schematically illustrating examples of PWM driving sub-frames and PAM driving current levels which may be employed in the hybrid driving method of the pixel circuit in FIG. 20.

FIG. 21 is an exemplary diagram schematically illustrating examples of PWM driving sub-frames and PAM driving current levels which may be employed in the hybrid driving method of the pixel circuit in FIG. 20.

Referring to FIG. 21, the hybrid driving method uses four PAM driving current levels by four sequential or parallel data sources DATA0, DATA1, DATA2, and DATA3 of a data driver and a PWM signal having four sub-frames in a single frame. The four PAM driving current levels may respectively include predetermined data voltages $V_{DATA0}$, $V_{DATA1}$, $V_{DATA2}$, and $V_{DATA3}$. Further, the hybrid driving method may be performed with the SES driving method.

Accordingly, in the hybrid driving method of the embodiment, the third transistor may perform a turn-on operation for the emission time of the light-emitting element so that the separated scan time may not be present between adjacent sub-frames t, the emission time may overlap the scan time, and the capacitor may be charged for the scan time which overlaps the emission time.

Figure 22:
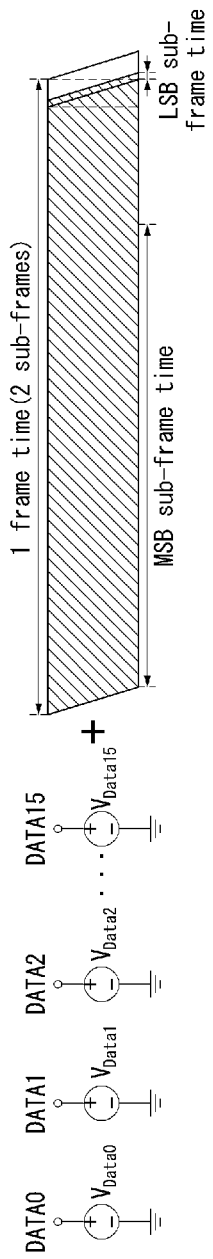
FIG. 22 is an exemplary diagram schematically illustrating another embodiment of the PWM driving sub-frames and the PAM driving current levels which may be employed in the hybrid driving method of the pixel circuit in FIG. 20.

FIG. 22 is an exemplary diagram schematically illustrating another embodiment of the PWM driving sub-frames and the PAM driving current levels which may be employed in the hybrid driving method of the pixel circuit in FIG. 20.

Referring to FIG. 22, the hybrid driving method uses sixteen PAM driving current levels by sixteen data sources DATA0, DATA1, DATA2, . . . , and DATA15 and a PWM signal having two sub-frames in the single frame. Further, the hybrid driving method is performed with the SES driving method.

Accordingly, in the hybrid driving method of the embodiment, the third transistor may perform a turn-on operation for the emission time of the light-emitting element so that the separated scan time may not be present between adjacent sub-frames, the emission time may overlap the scan time, and the capacitor may be charged for the scan time which overlaps the emission time.

Figure 23:
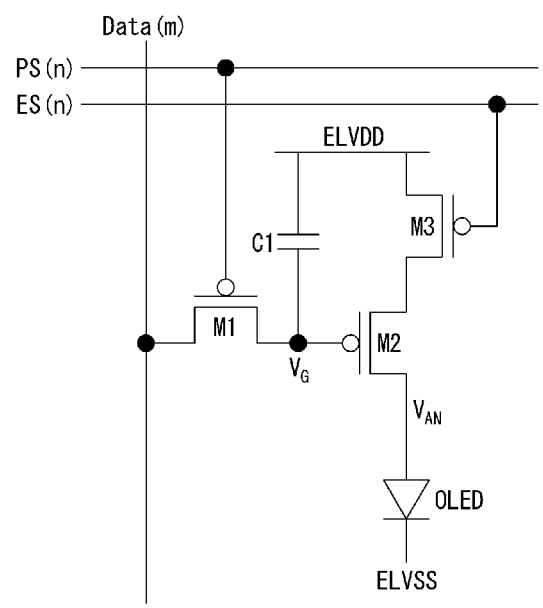
FIG. 23 is a circuit diagram of a pixel circuit in another form to which the hybrid driving method of the embodiment is applicable.
Figure 24:
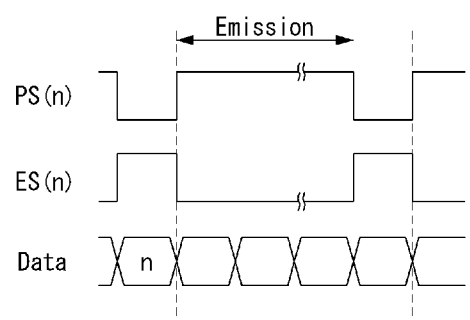
FIG. 24 is a timing diagram for describing a main operating principle of the pixel circuit in FIG. 23.

FIG. 23 is a circuit diagram of a pixel circuit in another form to which the hybrid driving method of the embodiment is applicable. FIG. 24 is a timing diagram for describing a main operating principle of the pixel circuit in FIG. 23.

Referring to FIG. 23, the pixel circuit applicable to the hybrid driving method may include a structure including three transistors M1, M2, and M3 and one capacitor C1.

In the pixel circuit, a first terminal of a first transistor M1 is connected to an m-th data line data (m), a first control terminal of the first transistor M1 is connected to an n-th gate line gate (n) line (also referred to as a scan line), and a second terminal of the first transistor M1 is commonly connected to a control terminal of a driving transistor M2 and a second terminal of the capacitor C1.

A first terminal of the driving transistor M2 is commonly connected to a first power supply voltage ELVDD and the second terminal of the capacitor, and a second terminal of the driving transistor M2 is connected to a first terminal of a light-emitting element, that is, an anode of an organic light emitting diode (OLED). A second terminal of the light-emitting element, that is, a cathode of the OLED is connected to a second power supply voltage ELVSS or the ground. The driving transistor M2 may be referred to as a second transistor.

Further, a first terminal of a third transistor M3 is connected to the first power supply voltage ELVDD, a third control terminal of the third transistor M3 is connected to an n-th erasing line ES(n) or erasing wiring, and a second terminal of the third transistor M3 is commonly connected to the second terminal of the first transistor M1, the control terminal of the driving transistor M2, and the second terminal of the capacitor C1.

The pixel circuit of the above-described configuration may be driven in a simultaneous erasing scan (SES) method. SES driving operates so that an emission time and a scan time overlap each other by an erasing operation through the third transistor M3 according to the lengths of the emission time and the scan time of the light-emitting element, and the emission time of the light-emitting element is relatively long compared to the DPS method.

As shown in FIG. 24, the hybrid driving method of the embodiment may be configured to repeat a process in which the third transistor M3 performs a turn-off operation according to a signal of the n-th erasing line ES(n) in a state in which the first transistor M1 is turned on according to a PWM signal of an n-th scan line PS(n) for a first time, and the third transistor M3 performs a turn-on operation according to the signal of the n-th erasing line ES(n) in a state in which the first transistor M1 is turned off according to the PWM signal of the n-th scan line PS(n) for the emission time in which the light-emitting element emits light. According to this configuration, the third transistor M3 performs the turn-off operation according to a level of a control signal of the erasing line ES(n), and the light-emitting element may operate to express a gray scale or luminance of a predetermined level according to data input in a floating state.

FIG. 25 is a schematic block diagram of a display module using the hybrid driving method of the embodiment.

Referring to FIG. 25, a display module 100 may include a data driver 110, a gate driver 120, a pixel unit 130A, a timing controller 140, and a power supply device 150. The gate driver 120 may be referred to as a scan driver.

The pixel unit 130A includes a plurality of pixels 130 each located near intersection points where data lines 112 of the data driver 110 and scan lines 122 of the gate driver 120 intersect. Each of the plurality of pixels 130 may correspond to any one of a unit pixel constituting the pixel unit 130A of the display device and a sub-pixel of the unit pixel.

A plurality of data drivers 110 may be provided and arranged on one edge of the pixel unit 130A. The data driver 110 may include a plurality of data lines 112 extending into the pixel unit 130A in a first direction, and may respectively supply data signals to pixel circuits of the pixels 130 through the data lines. The data signal may include a PAM signal of any one level selected from PAM (pulse amplitude modulation) signals having at least two different levels.

A plurality of gate drivers 120 may be provided and may be arranged on another edge of the pixel unit 130A. The gate driver 120 may include a plurality of scan lines 122 extending into the pixel unit 130A in a second direction approximately orthogonal to the first direction, and may respectively supply scan signals to the pixel circuits of the pixels 130 through the scan lines. The scan signal may include a pulse width modulation (PWM) signal having a plurality of sub-frames in a number smaller than the number of bits for gray scale data to be expressed.

The timing controller 140 controls operation timings of the data drivers 110 and the gate drivers 120. The timing controller 140 may transmit the PAM signal to the data drivers 110 and the PWM signal to the gate drivers 120 based on an image signal of every frame to be input.

The power supply device 150 is a component which may be selectively included, and may include its own power source such as a battery or the like or may be connected to an external commercial power source, and may supply necessary power to the data drivers 110, the gate drivers 120, the pixel unit 130A, and the timing controller 140.

Figure 26:
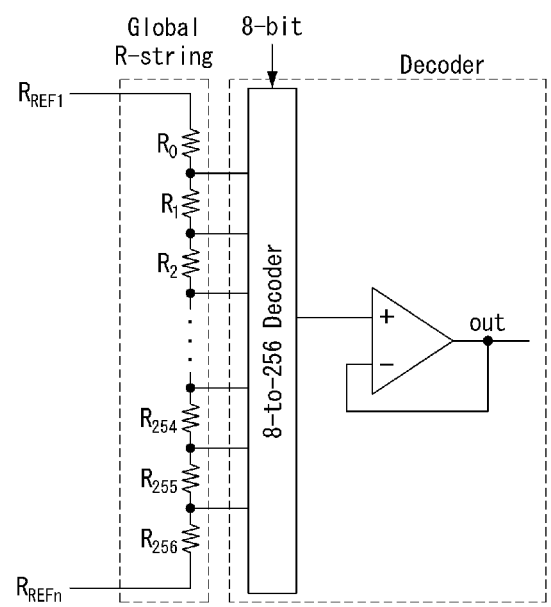
FIG. 26 is an exemplary diagram schematically illustrating a decoder used in a data driver of a display module of a comparative example.
Figure 27:
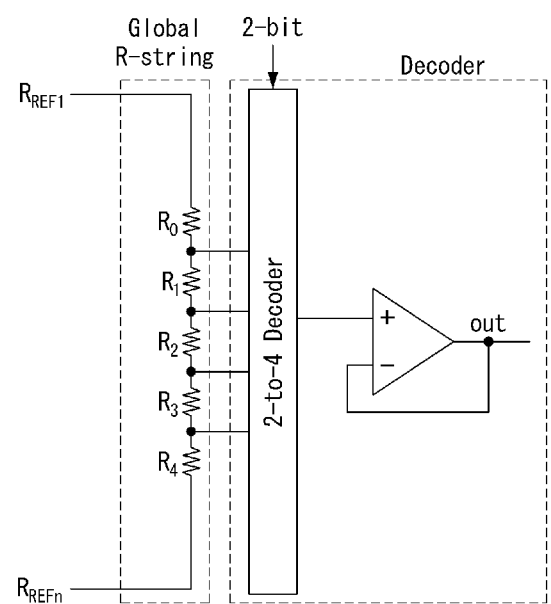
FIG. 27 is a schematic exemplary diagram of the decoder of the data driver which may be employed in the display module in FIG. 25.

FIG. 26 is an exemplary diagram schematically illustrating a decoder used in a data driver of a display module of a comparative example. FIG. 27 is a schematic exemplary diagram of the decoder of the data driver which may be employed in the display module in FIG. 25. Further, FIG. 28 is an exemplary diagram of another structure of the decoder of the data driver which may be employed in the display module in FIG. 25.

Referring to FIG. 26, the data driver of the display module of the comparative example includes an 8-bit decoder which receives a plurality of reference input voltages distributed from reference voltages $V_{REF1}$ to $V_{REFn}$ through a general-purpose resistor series circuit (global R-string) composed of 257 resistors ($R_0$ to $R_{256}$) to express an 8-bit luminance or gray scale in the pixel circuit of each pixel. The 8-bit decoder may output data signals of different levels of 8-bit to 256-bit, and may be provided with an amplifier at an output terminal thereof.

Meanwhile, referring to FIG. 27, the decoder of the data driver which may be employed in the display module of the embodiment may include a 2-bit decoder which receives a plurality of reference input voltages distributed from reference voltages $V_{REF1}$ to $V_{REFn}$ through a general-purpose resistor series circuit (global R-string) composed of five resistors ($R_0$ to $R_4$). The 2-bit decoder may output data signals of different levels of 2-bit to 4-bit, and may be provided with an amplifier at an output terminal thereof.

Figure 28:
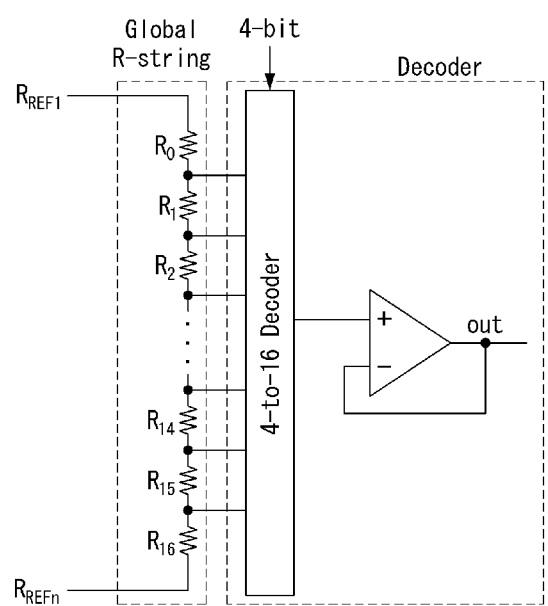
FIG. 28 is an exemplary diagram of another structure of the decoder of the data driver which may be employed in the display module in FIG. 25.

Similarly, referring to FIG. 28, the decoder of the data driver which may be employed in the display module of the embodiment may include a 4-bit decoder which receives a plurality of reference input voltages distributed from reference voltages $V_{REF1}$ to $V_{REFn}$ through a general-purpose resistor series circuit (global R-string) composed of seventeen resistors ($R_0$ to $R_{16}$). The 4-bit decoder may output data signals of different levels of 4-bit to 16-bit, and may be provided with an amplifier at an output terminal thereof.

Like the above, the data driver used in the display module of the embodiment may include an encoder having an area or size which is approximately 32 to 256 times smaller than an encoder of the 8-bit data driver of the comparative example in consideration of a case in which 100 or more decoders are usually used.

Meanwhile, in the pixel circuits of the above-described embodiments, although the first transistor or the driving transistor has been basically described based on a P-type transistor, but the present disclosure is not limited to this configuration and may be implemented using an N-type transistor. In this case, since the configuration such as the circuit configuration, the level of the control signal, or the like which is changed to be suitable for the N-type transistor is obvious to those skilled in the art, the detailed descriptions thereof will be omitted.

The operations of the method according to the exemplary embodiment of the present disclosure can be implemented as a computer readable program or code in a computer readable recording medium. The computer readable recording medium may include all kinds of recording apparatus for storing data which can be read by a computer system. Furthermore, the computer readable recording medium may store and execute programs or codes which can be distributed in computer systems connected through a network and read through computers in a distributed manner.

The computer readable recording medium may include a hardware apparatus which is specifically configured to store and execute a program command, such as a ROM, RAM or flash memory. The program command may include not only machine language codes created by a compiler, but also high-level language codes which can be executed by a computer using an interpreter.

Although some aspects of the present disclosure have been described in the context of the apparatus, the aspects may indicate the corresponding descriptions according to the method, and the blocks or apparatus may correspond to the steps of the method or the features of the steps. Similarly, the aspects described in the context of the method may be expressed as the features of the corresponding blocks or items or the corresponding apparatus. Some or all of the steps of the method may be executed by (or using) a hardware apparatus such as a microprocessor, a programmable computer or an electronic circuit. In some embodiments, one or more of the most important steps of the method may be executed by such an apparatus.

In some exemplary embodiments, a programmable logic device such as a field-programmable gate array may be used to perform some or all of functions of the methods described herein. In some exemplary embodiments, the field-programmable gate array may be operated with a microprocessor to perform one of the methods described herein. In general, the methods are preferably performed by a certain hardware device.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A pixel circuit driving method of controlling an operation of a light-emitting element provided in a pixel of a display panel, the pixel circuit driving method comprising:
applying pulse amplitude modulation (PAM) signals having a plurality of levels to a first terminal of a first transistor having a second terminal connected to a control terminal of a second transistor configured to drive the light-emitting element with a corresponding current according to a gray scale required for the light-emitting element; and
applying a PAM signal of any one level selected from the PAM signals to the control terminal of the second transistor during each sub-frame time corresponding to a turn-on time of the first transistor controlled by a pulse width modulation (PWM) signal having a plurality of sub-frames in a single frame according to the gray scale.

2. The pixel circuit driving method of claim 1, wherein the number of sub-frames of the PWM signal is smaller than the number of bits for expressing a gray scale preset for the light-emitting element.

3. The pixel circuit driving method of claim 1,
wherein the pixel circuit includes the first transistor, the second transistor, and a capacitor,
wherein the first transistor includes the first terminal, the second terminal, and a first control terminal,
wherein the second transistor includes a first terminal, a second terminal, and the second control terminal,
wherein the first terminal and the second terminal of the second transistor are respectively connected to the light-emitting element and a first power supply voltage,
wherein a first terminal of the capacitor connects to the first terminal or the second terminal of the second transistor, and
wherein a second terminal of the capacitor commonly connects to the second terminal of the first transistor and the second control terminal of the second transistor.

4. The pixel circuit driving method of claim 3,
wherein the pixel circuit further includes a third transistor,
wherein the capacitor is connected between a terminal at one side of the second transistor and the second terminal of the first transistor,
wherein a first terminal of the third transistor is connected to the first power supply voltage,
wherein a second terminal of the third transistor is commonly connected to the second terminal of the capacitor, the second terminal of the first transistor, and the second control terminal of the second transistor, and
wherein the pixel circuit driving method further comprise turning on the third transistor to charge the capacitor.

5. The pixel circuit driving method of claim 3,
wherein the pixel circuit further includes a capacitor and a third transistor,
wherein the capacitor is connected between a terminal at one side of the second transistor and the second terminal of the first transistor,
wherein the third transistor is connected in series between the first power supply voltage and the light-emitting element, and
wherein the pixel circuit driving method further comprises turning off the third transistor when an emission time of the light-emitting element overlaps a scan time in which any one PWM signal is applied.

6. The pixel circuit driving method of claim 1, wherein a scan time in which the PWM signal is applied overlaps an emission time of the light-emitting element.

7. The pixel circuit driving method of claim 1, wherein a scan time in which the PWM signal is applied does not overlap an emission time of the light-emitting element.

8. A pixel circuit for controlling an operation of a light-emitting element provided in a pixel of a display panel, the pixel circuit comprising:
a second transistor having a first terminal and a second terminal respectively connected to the light-emitting element and a first power supply voltage;
a first transistor having a second terminal connected to a control terminal of the second transistor and a first terminal connected to data lines; and
a capacitor having a first terminal connected to the first power supply voltage and a second terminal commonly connected to the second terminal of the first transistor and the control terminal of the second transistor,
wherein pulse amplitude modulation (PAM) signals having a plurality of levels are level-selectively applied to the first terminal of the first transistor through the data lines,
wherein a pulse width modulation (PWM) signal having a plurality of sub-frames in a single frame is applied to the control terminal of the first transistor according to the number of preset bits or gray scales of levels, and
wherein a PAM signal of any one level selected from the PAM signals is applied to the control terminal of the second transistor during each sub-frame period of the PWM signal for a turn-on time of the first transistor controlled by the PWM signal according to a gray scale required for the light-emitting element.

9. The pixel circuit of claim 8, wherein the number of sub-frames of the PWM signal is smaller than the number of bits for expressing a gray scale preset for the light-emitting element.

10. The pixel circuit of claim 8, further comprising a third transistor,
wherein a first terminal of the third transistor is connected to the first power supply voltage, and a second terminal of the third transistor is commonly connected to the second terminal of the capacitor, the second terminal of the first transistor, and the control terminal of the second transistor.

11. The pixel circuit of claim 10, wherein the capacitor is charged in a turn-on period of the third transistor.

12. The pixel circuit of claim 8, further comprising a third transistor connected in series between a common connection point of the light-emitting element and the first terminal of the capacitor and the first power supply voltage.

13. The pixel circuit of claim 12, wherein the third transistor is turned off when an emission time of the light-emitting element overlaps a scan time in which the PWM signal is applied.

14. A display module comprising:
a pixel unit in which pixels are arranged;
a data driver configured to supply a data signal to the pixel unit;
a gate driver configured to supply a scan signal to the pixel unit; and
a timing controller configured to control operations of the data driver and the gate driver,
wherein the data driver applies pulse amplitude modulation (PAM) signals having a plurality of levels as the data signal to a first terminal of a first transistor having a second terminal connected to a control terminal of a second transistor according to a gray scale required for a light-emitting element coupled to each pixel,
wherein the gate driver applies a pulse width modulation (PWM) signal having a plurality of sub-frames in a single frame as the scan signal to a control terminal of the first transistor according to the gray scale, and
wherein a PAM signal of any one level selected from the PAM signals is applied to the control terminal of the second transistor configured to supply a corresponding current to the light-emitting element, according to the gray scale required for the light-emitting element, for a turn-on time of the first transistor or for each sub-frame.

15. The display module of claim 14, wherein the number of sub-frames of the PWM signal is smaller than the number of bits of gray scale data set for at least one pixel or a sub-pixel included in the at least one pixel.

16. The display module of claim 14, wherein a pixel circuit configured to drive the light-emitting element of the pixel or sub-pixel with a current includes:
the second transistor having a first terminal and a second terminal respectively connected to the light-emitting element and a first power supply voltage;
the first transistor having the second terminal connected to the control terminal of the second transistor and the first terminal connected to data lines; and
a capacitor having a first terminal connected to the first power supply voltage and a second terminal commonly connected to the second terminal of the first transistor and the control terminal of the second transistor.

17. The display module of claim 16,
wherein the pixel circuit further includes a third transistor,
wherein a first terminal of the third transistor is connected to the first power supply voltage,
wherein a second terminal of the third transistor is commonly connected to the second terminal of the capacitor, the second terminal of the first transistor, and the second control terminal of the second transistor, and
wherein the capacitor is charged in a turn-on period of the third transistor.

18. The display module of claim 16, wherein the pixel circuit further includes a third transistor connected in series between a common connection point of the light-emitting element and the first terminal of the capacitor and the first power supply voltage.

19. The display module of claim 18, wherein the third transistor is turned off when an emission time of the light-emitting element overlaps a scan time in which the PWM signal is applied.

20. The display module of claim 14, wherein the number of output channels of a decoder provided in the data driver is smaller than the number of preset gray scales expressed by a predetermined bit.

* * * * *